United States Patent
Ohnishi et al.

(10) Patent No.: US 12,126,321 B2
(45) Date of Patent: Oct. 22, 2024

(54) PIEZOELECTRIC VIBRATING DEVICE

(71) Applicant: DAISHINKU CORPORATION, Kakogawa (JP)

(72) Inventors: Manabu Ohnishi, Kakogawa (JP); Koji Nakamura, Kakogawa (JP); Takuya Kojo, Kakogawa (JP); Kohei Hasegawa, Kakogawa (JP)

(73) Assignee: DAISHINKU CORPORATION, Kakogawa (JP)

( * ) Notice: Subject to any disclaimer, the term of this patent is extended or adjusted under 35 U.S.C. 154(b) by 699 days.

(21) Appl. No.: 17/429,918

(22) PCT Filed: Jan. 16, 2020

(86) PCT No.: PCT/JP2020/001233
§ 371 (c)(1),
(2) Date: Aug. 10, 2021

(87) PCT Pub. No.: WO2020/174915
PCT Pub. Date: Sep. 3, 2020

(65) Prior Publication Data
US 2022/0131519 A1 Apr. 28, 2022

(30) Foreign Application Priority Data
Feb. 28, 2019 (JP) .................. 2019-035579

(51) Int. Cl.
*H03H 9/10* (2006.01)
*H03H 3/02* (2006.01)
*H03H 9/19* (2006.01)

(52) U.S. Cl.
CPC ............ *H03H 9/1042* (2013.01); *H03H 3/02* (2013.01); *H03H 9/19* (2013.01); *H03H 2003/022* (2013.01)

(58) Field of Classification Search
CPC ...... H03H 9/1042; H03H 9/19; H03H 9/0595; H03H 9/1035; H03H 3/02; H03H 2003/022
See application file for complete search history.

(56) References Cited

U.S. PATENT DOCUMENTS

| 4,684,843 A | 8/1987 | Ohya et al. |
| 6,163,101 A | 12/2000 | Yoshida et al. |

(Continued)

FOREIGN PATENT DOCUMENTS

| JP | 6-188670 A | 7/1994 |
| JP | 2001-102900 A | 4/2001 |

(Continued)

OTHER PUBLICATIONS

Machine translation of JP2014123861A (Year: 2014).*

*Primary Examiner* — Emily P Pham
(74) *Attorney, Agent, or Firm* — Norris McLaughlin, P.A.

(57) ABSTRACT

A piezoelectric vibrating device according to the present invention is provided with: a piezoelectric vibration plate having first and second driving electrodes respectively formed on main surfaces on both sides thereof, the piezoelectric vibration plate further having first and second mounting terminals that are respectively connected to the first and second driving electrodes. The piezoelectric vibrating device is also provided with first and second sealing members respectively joined to the main surfaces on both sides of the piezoelectric vibration plate in a manner that the first and second driving electrodes of the piezoelectric vibration plate are covered with these sealing members. At least one of the first and second sealing members includes a film made of a resin.

16 Claims, 8 Drawing Sheets

(56) References Cited

U.S. PATENT DOCUMENTS

| 7,893,600 B2 | 2/2011 | Furue et al. | |
|---|---|---|---|
| 2010/0033268 A1* | 2/2010 | Iizuka .................. | H03H 9/1014 |
| | | | 333/187 |

FOREIGN PATENT DOCUMENTS

| JP | 2005-184325 A | 7/2005 |
| JP | 2006-311015 A | 11/2006 |
| JP | 2008-160332 A | 7/2008 |
| JP | 2008-205761 A | 9/2008 |
| JP | 2014-123861 A | 7/2014 |
| JP | 2015-128147 A | 7/2015 |
| JP | 2018-117243 A | 7/2018 |
| WO | 2007/026428 A | 3/2007 |

* cited by examiner

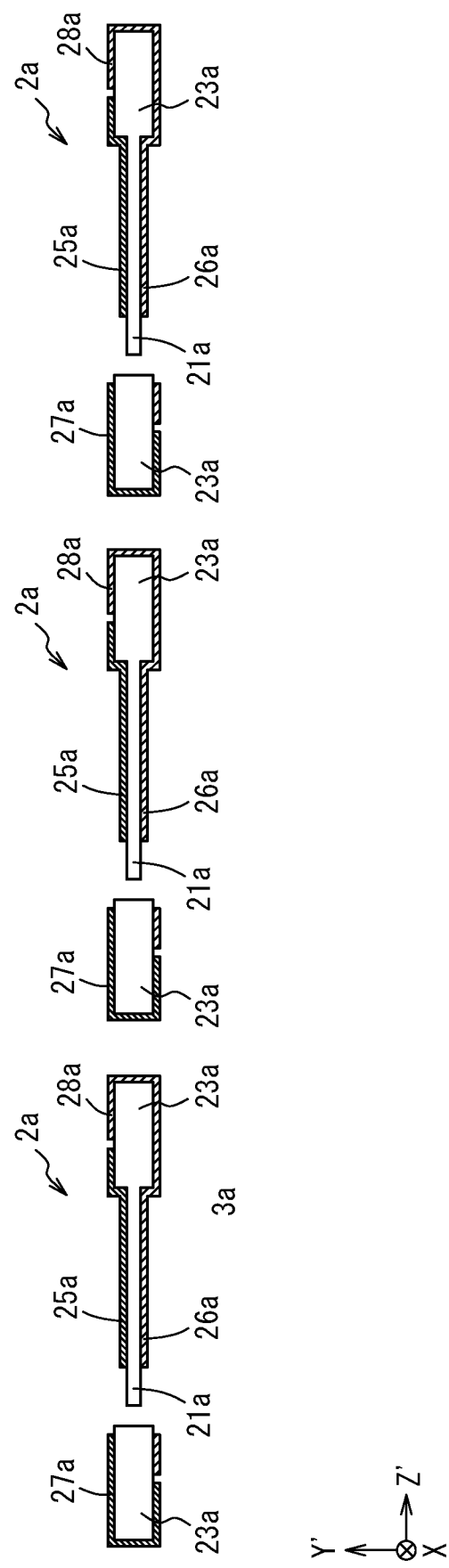

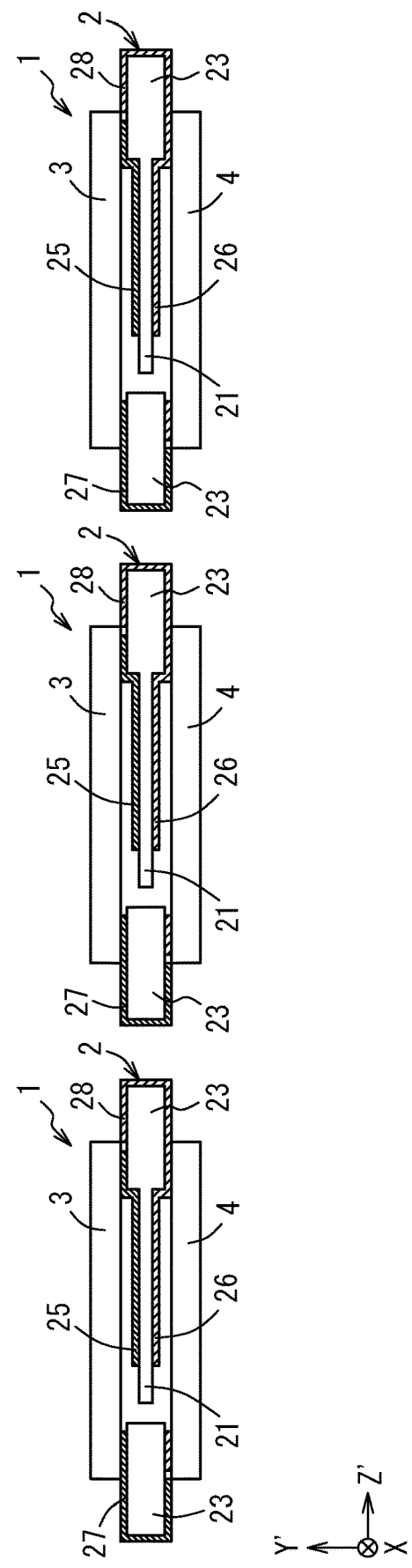

PIEZOELECTRIC VIBRATING DEVICE

TECHNICAL FIELD

This present invention relates to a piezoelectric vibration device, examples of which may include piezoelectric vibrators.

BACKGROUND ART

Surface-mounted piezoelectric vibrators are typical examples of the piezoelectric vibration devices which have been and are currently used in a broad range of applications. Patent document 1 describes an example of such surface-mounted piezoelectric vibrators. In the piezoelectric vibrator of this example is used a ceramic-made, box-shaped base having an opening on its upper side. A piezoelectric vibration piece (crystal piece) is mounted on this base in the following manner; electrodes are led out from driving electrodes formed on surfaces on both sides of the piezoelectric vibration piece, and these led-out electrodes are fixedly joined, with an electrically conductive adhesive, to electrodes held in the base. Then, a lid member is firmly joined to the opening of the base mounted with the piezoelectric vibration piece, so that the base is air-tightly sealed. On an outer bottom surface of the base are formed terminals for surface mounting of this piezoelectric vibrator.

CITATION LIST

Patent Document

Patent Document 1; JP 2005-184325 A

SUMMARY OF INVENTION

Technical Problems

In the crystal vibrators as described above, the package is mostly so structured that a metal or glass-made lid member is joined to a ceramic base. Such packages are often costly, which may inevitably lead to higher prices of the piezoelectric vibrators.

To address such cost-related issues of the known art, the present invention is directed to providing an inexpensive piezoelectric vibration device.

Solutions to the Problems

To this end, the present invention provides the following technical features.

A piezoelectric vibration device according to the present invention includes: a piezoelectric vibration plate having a first driving electrode and a second driving electrode, the first driving electrode being formed on one of main surfaces on both sides of the piezoelectric vibration plate, the second driving electrode being formed on the other one of the main surfaces on both sides of the piezoelectric vibration plate, the piezoelectric vibration plate further having first and second mounting terminals that are respectively connected to the first and second driving electrodes; and first and second sealing members that are respectively joined to the main surfaces on both sides of the piezoelectric vibration plate in a manner that the first and second driving electrodes of the piezoelectric vibration plate are covered with the first and second sealing members. The piezoelectric vibration device is further characterized in that at least one of the first and second sealing members is a film including a resin.

In the piezoelectric vibration device provided by the present invention, the piezoelectric vibration plate has the first and second driving electrodes on its main surfaces on both sides and further has the first and second mounting terminals that are respectively connected to the first and second driving electrodes, and the first and second sealing members are joined to the piezoelectric vibration plate in a manner that the first and second driving electrodes are covered with these sealing members. Conventionally, piezoelectric vibration pieces may often have to be mounted in bases where mounting terminals are disposed. This, however, may no longer be necessary according to the present invention and may accordingly eliminate the need to prepare high-priced bases.

Further advantageously, at least one of the first and second sealing members uses or includes a resinous film, which may allow cost reduction as compared with, for example, metal or glass-made lid members being included in or used as the sealing members.

In a preferred embodiment of the piezoelectric vibration device according to the present invention, the first and second sealing members may be each the film including a resin.

According to this embodiment, including or using the resinous film in or as both of the sealing members makes it unnecessary to prepare costly bases and lid members. As a result, further cost reduction may be favorably achieved.

In another embodiment of the piezoelectric vibration device according to the present invention, the piezoelectric vibration plate may include: a vibrating portion in which the first and second driving electrodes are formed on the main surfaces on both sides; and an outer frame surrounding an outer circumference of the vibrating portion and coupled to the vibrating portion through a coupling portion. The piezoelectric vibration device may be further characterized in that the vibrating portion is smaller in thickness than the outer frame, and circumferential ends of the film are respectively joined to main surfaces on both sides of the outer frame to seal the vibrating portion.

According to this embodiment, circumferential ends of the film are respectively joined to the main surfaces on both sides of the outer frame surrounding the outer circumference of the thinner vibrating portion. Thus, the vibrating portion may be successfully sealed without any contact with the film joined to the main surfaces on both sides of the outer frame.

In yet another embodiment of the piezoelectric vibration device according to the present invention, the piezoelectric vibration plate may have a rectangular shape in plan view. The piezoelectric vibration device may be further characterized in that the first mounting terminal is formed in the outer frame at one end of the piezoelectric vibration plate in a direction along one of two pairs of opposing sides of the rectangular shape in plan view, and the second mounting terminal is formed in the outer frame at another end of the piezoelectric vibration plate in the direction.

According to this embodiment, the first and second mounting terminals are formed at one end and the other end in a direction along a pair of opposing sides of the rectangular piezoelectric vibration plate. Thus, the piezoelectric vibration device may be successfully mounted on, for example, a circuit board by bonding the first and second mounting terminals to the board with a bonding material such as solder, metallic bump, and/or wire.

In another preferred embodiment of the piezoelectric vibration device according to the present invention, the first and second mounting terminals may be formed on a respective one of the main surfaces on both sides of the outer frame. The piezoelectric vibration device may be further characterized in that the first mounting terminals on the main surfaces on both sides are electrically connected to each other, and the second mounting terminals on the main surfaces on both sides are electrically connected to each other.

According to this embodiment in which the mounting terminals on the main surfaces are electrically interconnected, either one of the main surfaces on front and back sides may be available at the time when the piezoelectric vibration device is mounted on, for example, a circuit board.

The piezoelectric vibration device according to yet another embodiment of the present invention may be characterized in that a first sealing pattern is formed on one of the main surfaces on both sides of the outer frame, the first sealing pattern being a pattern to which the film is joined, the first sealing pattern surrounding the vibrating portion and being formed to interconnect the first driving electrode and the first mounting terminal. The piezoelectric vibration device according to this embodiment may be further characterized in that a second sealing pattern is formed on the other one of the main surfaces on both sides of the outer frame, the second sealing pattern being a pattern to which the film is joined, the second sealing pattern surrounding the vibrating portion and being formed to interconnect the second driving electrode and the second mounting terminal.

According to this embodiment, the first and second sealing patterns respectively formed on the main surfaces of the outer frame may allow electrical connection between the first driving electrode and the first mounting terminal and between the second driving electrode and the second mounting terminal. Further advantageously, the vibrating portion may be reliably sealed by firmly bonding the film to the first and second sealing patterns that surround the vibrating portion.

The piezoelectric vibration device according to yet another embodiment of the present invention may be characterized in that the first sealing pattern and the second sealing pattern each have an extended portion extending along the one of the two pairs of opposing sides of the rectangular shape in plan view, and the extended portions have a width smaller than a width of the outer frame extending along the one of the two pairs of opposing sides.

In case the extended portions of the two sealing patterns are formed in an equal width to the outer frame, i.e., the extended portions are formed along the entire width of the outer frame, the extended portions on one and the other main surface may accidentally run around the lateral surfaces of the outer frame, possibly inviting such an unfavorable event as short circuit. According to this embodiment, on the other hand, the extended portion of the first sealing pattern formed on one of the main surfaces of the outer frame and the extended portion of the second sealing pattern formed on the other main surface are both smaller in width than the outer frame. This may successfully avoid the occurrence of short circuit.

In yet another preferred embodiment of the piezoelectric vibration device according to the present invention, the film may include a heat-resistant resin.

According to this embodiment, the film used to seal the vibrating portion of the piezoelectric vibration plate is made of a heat-resistant resin. The film made of such a material may be unlikely to deform during the process of reflow soldering employed to manufacture the piezoelectric vibration device.

In yet another preferred embodiment of the piezoelectric vibration device according to the present invention, the film may include a thermoplastic adhesive layer on at least one surface thereof.

According to this embodiment, a surface of the film, on which the thermoplastic adhesive layer is formed, may be joined under heat by pressure bonding to the piezoelectric vibration plate.

In yet another preferred embodiment of the piezoelectric vibration device according to the present invention, the piezoelectric vibration plate may be a crystal vibration plate.

By using a crystal vibration plate as the piezoelectric vibration plate, the piezoelectric vibration device according to this embodiment may excel in frequency-temperature characteristics.

Advantageous Effects of the Invention

In the piezoelectric vibration device according to the present invention, the piezoelectric vibration plate is provided with: the first and second driving electrodes that are formed on the main surfaces on both sides thereof; and the first and second mounting terminals that are respectively connected to the first and second driving electrodes, and the first and second sealing members are joined to the piezoelectric vibration plate in a manner that the first and second driving electrodes are covered with these sealing members. Conventionally, piezoelectric vibration pieces may often have to be mounted in bases where the mounting terminals are disposed. This, however, may no longer be necessary according to the present invention and may accordingly eliminate the need to prepare high-priced bases.

Further advantageously, using a resinous film for at least one of the first and second sealing members may favorably achieve cost reduction, as compared with metallic or glass-made lid members being included in or used as both of the two sealing members, allowing an inexpensive piezoelectric vibration device to be successfully provided.

BRIEF DESCRIPTION OF DRAWINGS

FIG. 5C is a schematic view in cross section of the crystal vibrator illustrated to describe steps of manufacturing the crystal vibrator of FIG. 1.

FIG. 5E is a schematic view in cross section of the crystal vibrator illustrated to describe steps of manufacturing the crystal vibrator of FIG. 1.

DESCRIPTION OF EMBODIMENTS

An embodiment of the present invention is hereinafter described in detail referring to the accompanying drawings.

In the description of this embodiment, a crystal vibrator is used as an example of the piezoelectric vibration device.

Figure 1:
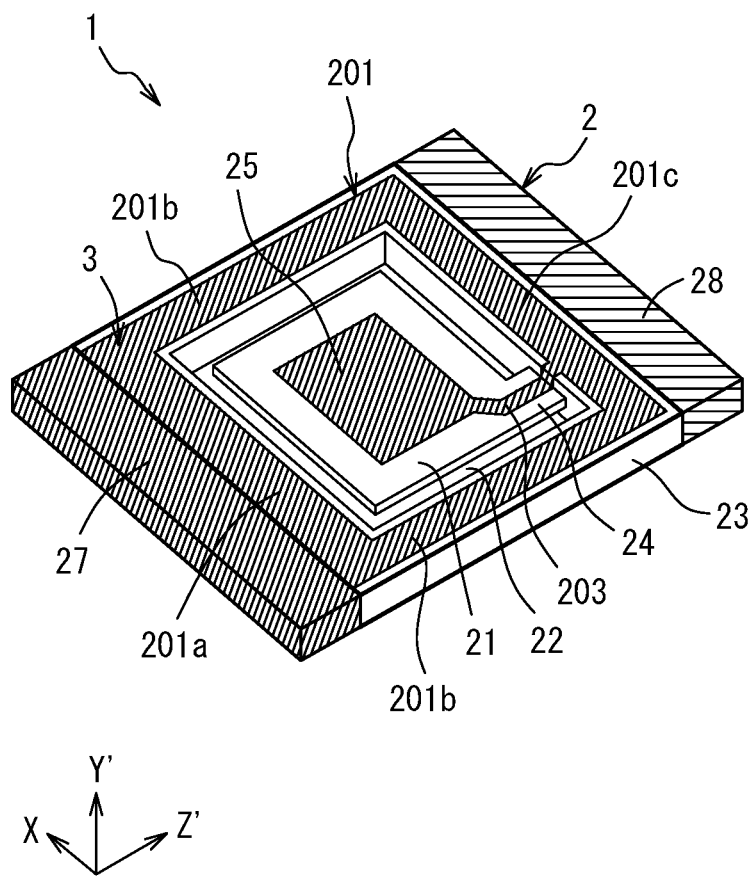
FIG. 1 is a schematic perspective view of a crystal vibrator according to an embodiment of the present invention.
Figure 2:
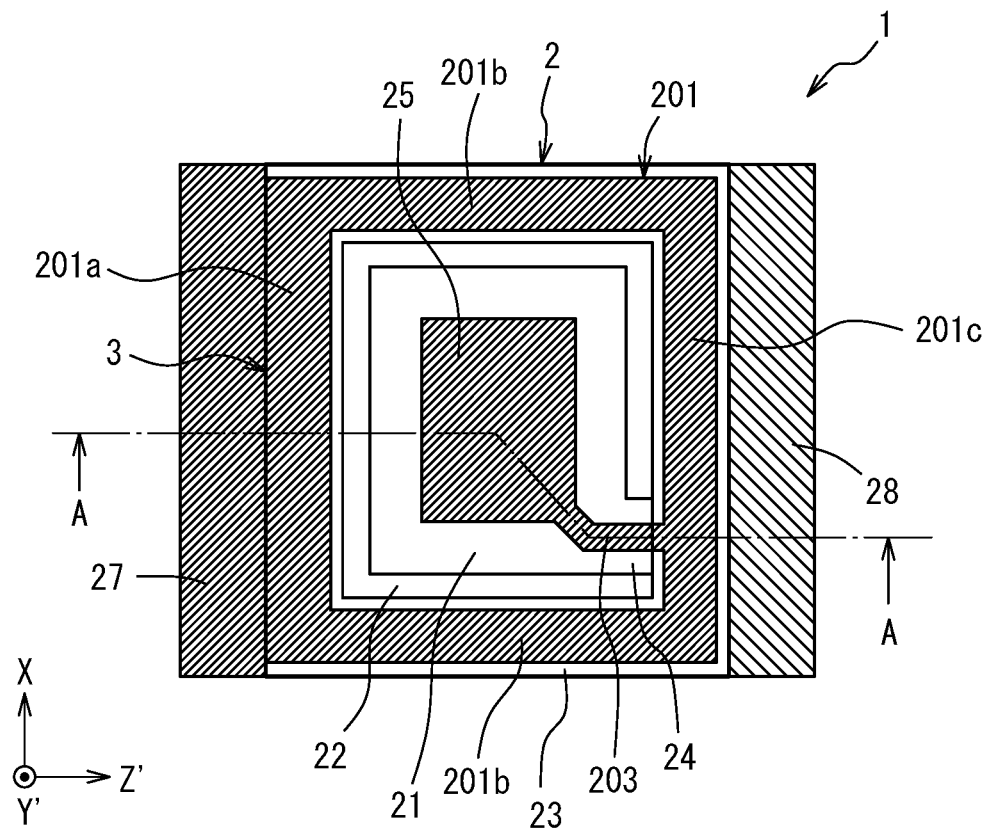
FIG. 2 is a schematic plan view of the crystal vibrator illustrated in FIG. 1.
Figure 3:
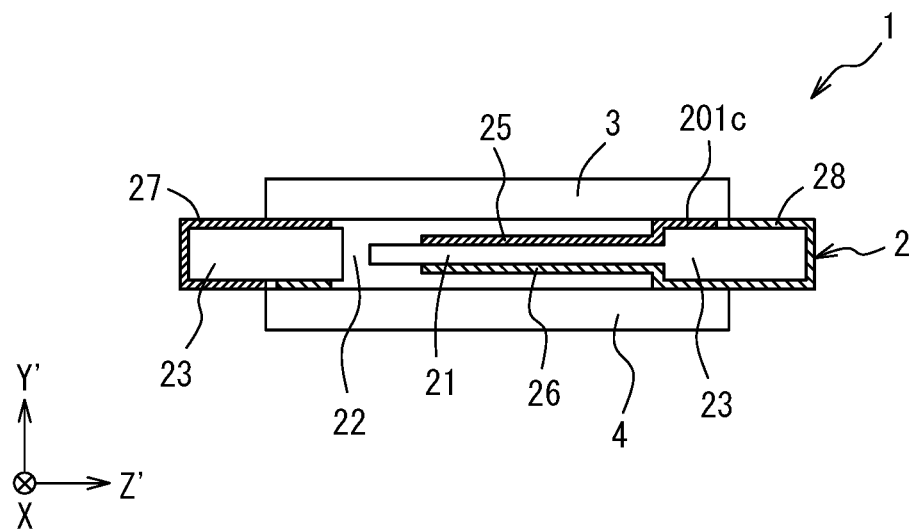
FIG. 3 is a schematic view in cross section of the crystal vibrator along A-A line illustrated in FIG. 2.
Figure 4:
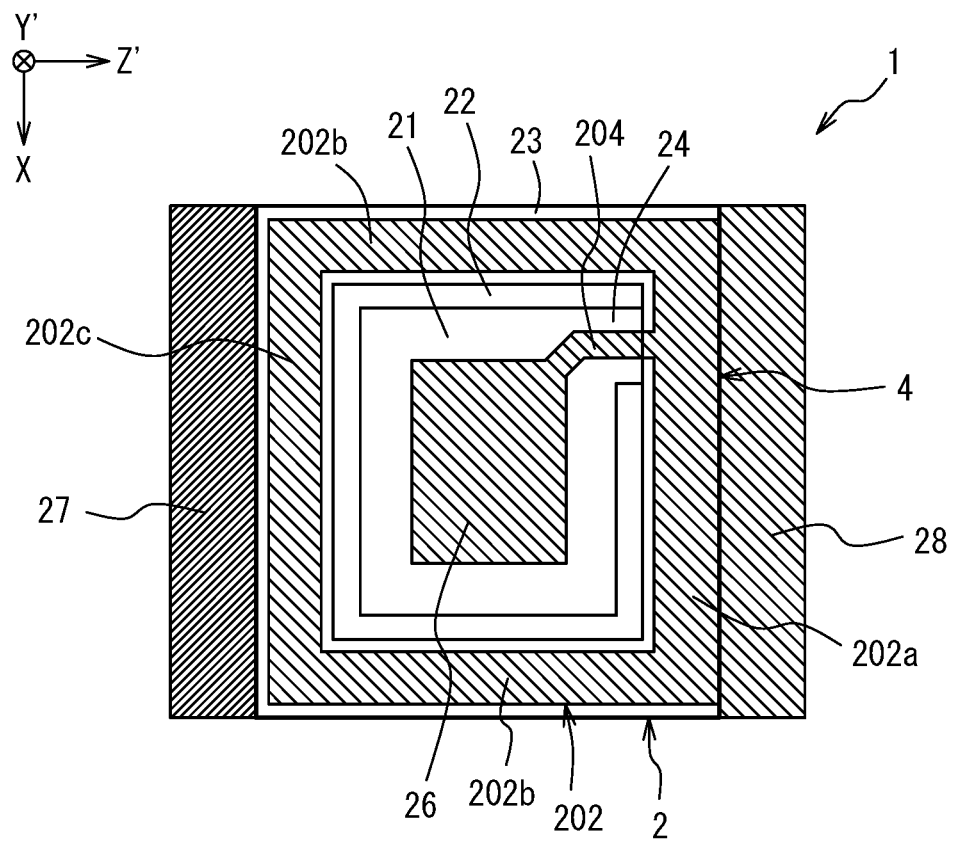
FIG. 4 is a schematic bottom view of the crystal vibrator illustrated in FIG. 1.

FIG. 1 is a schematic perspective view of a crystal vibrator according to an embodiment of the present invention. FIG. 2 is a schematic plan view of the crystal vibrator illustrated in FIG. 1. FIG. 3 is a schematic view in cross section of the crystal vibrator along A-A line illustrated in FIG. 2. FIG. 4 is a schematic bottom view of the crystal vibrator illustrated in FIG. 1. In FIGS. 3, and 5A to 5E described later, the thickness of a resin film, for example, may be exaggerated for the purpose of illustration.

A crystal vibrator 1 according to this embodiment includes a crystal vibration plate 2, a first resin film 3 as a first sealing member, and a second resin film 4 as a second sealing member. The first resin film 3 covers and seals one of the front and back main surfaces of the crystal vibration plate 2. The second resin film 4 covers and seals the other one of the front and back main surfaces of the crystal vibration plate 2.

This crystal vibrator 1 has a cuboidal shape and is rectangular in plan view. In this embodiment, the crystal vibrator 1 is relatively small in size and height; 1.2 mm×1.0 mm square, and 0.2 mm thick.

The size and thickness of the crystal vibrator 1 are not necessarily limited to these dimensions which were only mentioned as an example. The crystal vibrator 1 may be formed in other sizes, to which the present invention is also applicable.

Next, the crystal vibration plate 2 and the first and second resin films 3 and 4, which are structural elements of the crystal vibrator 1, are hereinafter described.

The crystal vibration plate 2 according to this embodiment is an AT-cut crystal plate obtained by processing a rectangular crystal plate through 35° 15' rotation around X axis of crystal, and front and back main surfaces of this plate are XZ' planes. In this embodiment, Z' axis is extending along long sides of the rectangular crystal vibration plate 2, while X axis is extending along short sides of the rectangular crystal vibration plate 2, as illustrated in FIGS. 2 and 4.

The crystal vibration plate 2 includes vibrating portions 21, outer frames 23, and coupling portions 24. The vibrating portions 21 are substantially rectangular in plan view. The outer frames 23 each surround the vibrating portion 21 with a penetrating portion 24 being interposed therebetween. The coupling portions 24 are each formed to couple the vibrating portion 21 to the outer frame 23. The vibrating portion 21 and the coupling portion 24 are formed in a smaller thickness than the outer frame 23.

In this embodiment, the vibrating portion 21 substantially rectangular in plan view is coupled to the outer frame 23 through the coupling portion 24 formed at one position; one corner, of the rectangular shape. This may reduce a stress possibly acted upon the vibrating portion 21, as compared with this portion being coupled to the outer frame at two or more positions.

In this embodiment, the coupling portion 24 protrudes from one side in the X-axis direction of an inner circumference of the outer frame 23 and then extends in the Z'-axis direction. The crystal vibration plate 2 has, at its both ends in the Z'-axis direction, first and second mounting terminals 27 and 28, and these first and second mounting terminals 27 and 28 are directly joined to, for example, a circuit board with a solder. As a result of these structural features, a contraction stress may possibly be generated in the long-side direction of the crystal vibrator (Z'-axis direction) and transmitted to the vibrating portion, in which case the crystal vibrator's oscillation frequency may be easily variable. In this embodiment, however, the coupling portion 24 is formed in a direction in which the contraction stress is transmittable. Thus, the contraction stress may be difficult to be transmitted to the vibrating portion 21. This may control the variability of the oscillation frequency at the time when the crystal vibrator 1 is mounted on a circuit board.

The vibrating portion 21 has, on its front and back main surfaces, a pair of first and second driving electrodes 25 and 26. In the outer frame 23 at both ends in the long-side direction (lateral direction on FIGS. 2 to 4) of the rectangular crystal vibration plate 2, first and second mounting terminals 27 and 28 are formed in the short-side direction of the crystal vibration plate 2 (vertical direction on FIGS. 2 and 4), and these first and second mounting terminals are respectively connected to the first and second driving electrodes 25 and 26. The first and second mounting terminals 27 and 28 are used to mount the crystal vibrator 1 on, for example, a circuit board.

On one of the main surfaces on both sides, the first mounting terminal 27 is continuous to a first sealing pattern 201 formed in a rectangular circular shape which will be described later, as illustrated in FIG. 2. On the other one of the main surfaces, the second mounting terminal 28 is continuous to a second sealing pattern 202 formed in a rectangular circular shape which will be described later, as illustrated in FIG. 4.

Thus, the first and second mounting terminals 27 and 28 are formed at both ends of the crystal vibration plate 2 in the long-side direction (direction along the Z' axis) across the vibrating portion 21 interposed between these mounting terminals.

The first mounting terminals 27 on the main surfaces of the crystal vibration plate 2 are electrically interconnected, and the second mounting terminals 28 on the main surfaces of the crystal vibration plate 2 are also electrically interconnected. In this embodiment, the first mounting terminals 27, as well as the second mounting terminals 28, are electrically interconnected through electrodes routed along lateral surfaces of opposing long sides of the crystal vibration plate 2 and are also electrically interconnected through end-face electrodes formed closer to opposing short sides of the crystal vibration plate 2.

On the front-surface side of the crystal vibration plate 2 is formed a first sealing pattern 201 to which the first resin film 3 is joined. The first sealing pattern 201 is formed in a rectangular frame-like shape in a manner that the rectangular vibrating portion 21 is surrounded by this sealing pattern. The first sealing pattern 201 includes a connecting portion 201a, first extended portions 201b, and a second extended portion 201c. The connecting portion 201a is continuous to the first mounting terminal 27. The first extended portions 201b extend from both ends of the connecting portion 201a in the long-side direction of the crystal vibration plate 2. The second extended portion 201c extends in the short-side direction of the crystal vibration plate 2 and serves to connect ends of extension of the first extended portions 201b. The second extended portion 201c is connected to a first extraction electrode 203 extracted from the first driving electrode 25. The first mounting terminal 27, therefore, is electrically connected to the first driving electrode 25 through the first extraction electrode 203 and the first sealing pattern 201. There is no electrode formed in a region; electrode-less region, between the second mounting terminal 28 and the second extended portion 201c extending in the short-side direction of the crystal vibration plate 2. This electrode-less region may ensure that the first sealing pattern 201 and the second mounting terminal 28 are electrically insulated from each other.

On the back-surface side of the crystal vibration plate 2 is formed a second sealing pattern 202 to which the second resin film 4 is joined. The second sealing pattern 202 is formed in a rectangular frame-like shape in a manner that the rectangular vibrating portion 21 is surrounded by this sealing pattern, as illustrated in FIG. 4. The second sealing pattern 202 includes a connecting portion 202a, first extended portions 202b, and a second extended portion 202c. The connecting portion 201 is continuous to the second mounting terminal 28. The first extended portions 202b extend from both ends of the connecting portion 202a in the long-side direction of the crystal vibration plate 2. The second extended portion 202c extends in the short-side direction of the crystal vibration plate 2 and serves to connect ends of extension of the first extended portions 202b. The connecting portion 202a is connected to a second extraction electrode 204 extracted from the second driving electrode 26. The second mounting terminal 28, therefore, is electrically connected to the second driving electrode 26 through the second extraction electrode 204 and the second sealing pattern 202. There is no electrode formed in a region; electrode-less region, between the first mounting terminal 27 and the second extended portion 202c extending in the short-side direction of the crystal vibration plate 2. This electrode-less region may ensure that the second sealing pattern 202 and the first mounting terminal 27 are electrically insulated from each other.

As illustrated in FIG. 2, the first extended portions 201b of the first sealing pattern 201 extending in the long-side direction of the crystal vibration plate 201b are smaller in width than the outer frame 23 extending in the long-side direction. This drawing also shows that the electrode-less region is present on both sides of the first extended portions 201b in the direction of width (vertical direction on FIG. 2).

Of the electrode-less regions on both sides of the first extended portions 201b, the electrode-less region on the outer side is extending as far as the first mounting terminal 27 and is continuous to the electrode-less region between the second mounting terminal 28 and the second extended portion 201c. Thus, the connecting portion 201a, first extended portions 201b, and second extended portion 201c of the first sealing pattern 201 are surrounded on their outer side by the electrode-less region in a substantially equal width. This electrode-less region extends from the outer side at one end of the connecting portion 201a extending in the short-side direction of the crystal vibration plate 2, then extends along one of the first extended portions 201b, and further extends from the end of extension of the first extended portion 201b along the second extended portion 201c. Then, the electrode-less region extends from the end of extension of the second extended portion 201c and further extends along the other one of the first extended portions 201b to the outer side at the other end of the connecting portion 201a.

An electrode-less region is formed on the inner side of the connecting portion 201a of the first sealing pattern 201 in the direction of width. This electrode-less region is continuous to the electrode-less region on the inner side of the first extended portions 201b. An electrode-less region is formed on the inner side of the second extended portion 201c in the direction of width, except the first extraction electrode 203 at the coupling portion 24. This electrode-less region is continuous to the electrode-less region on the inner side of the first extended portions 201b. Thus, the connecting portion 201a, first extended portions 201b, and second extended portion 201c of the first sealing pattern 201 are surrounded on their inner side by the electrode-less region having a rectangular circular shape in plan view in a substantially equal width, except the first extraction electrode 203 at the coupling portion 24.

As illustrated in FIG. 4, the first extended portions 202b of the second sealing pattern 202 extending in the long-side direction of the crystal vibration plate 2 are smaller in width than the outer frame 23 extending in the long-side direction. This drawing also shows that there are electrode-less regions on both sides of the first extended portion 201b, 201b in the direction of width (vertical direction on FIG. 4).

Of the electrode-less regions on both sides of the first extended portion 202b, 202b, the electrode-less region on the outer side is extending as far as the second mounting terminal 28 and is continuous to the electrode-less region between the first mounting terminal 27 and the second extended portion 202c. Thus, the connecting portion 202a, first extended portions 202b, and second extended portion 202c of the second sealing pattern 202 are surrounded on their outer side by the electrode-less region in a substantially equal width. This electrode-less region extends from the outer side at one end of the connecting portion 202a extending in the short-side direction of the crystal vibration plate 2, then extends along one of the first extended portions 202b, and further extends from the end of extension of the first extended portion 202b along the second extended portion 202c. Then, the electrode-less region extends from the end of extension of the second extended portion 202c and further extends along the other one of the first extended portions 202b to the outer side at the other end of the connecting portion 201a.

An electrode-less region is formed on the inner side of the connecting portion 202a of the second sealing pattern 202 in the direction of width, except the second extraction electrode 204 at the coupling portion 24. This electrode-less region is continuous to the electrode-less region on the inner side of the first extended portion 202b, 202b. An electrode-less region is formed on the inner side of the second extended portion 202c in the direction of width. This electrode-less region is continuous to the electrode-less region on the inner side of the first extended portion 201b, 201b. Thus, the connecting portion 202a, first extended portions 202b, and second extended portion 202c of the second sealing pattern 202 are surrounded on their inner side by the electrode-less region having a rectangular circular shape in plan view in a substantially equal width, except the second extraction electrode 204 at the coupling portion 24.

As described above, the first extended portions 201b and 202b of the first and second sealing patterns 201 and 202 are formed in a smaller width than the width of the outer frame 23, the electrode-less regions are disposed on both sides of the first extended portions 201b and 202b in the direction of width, and the electrode-less regions are disposed on the inner side of the connecting portions 201a and 202a and the second extended portions 201c 202c in the direction of width. To form these electrode-less regions, the first and second sealing patterns 201 and 202, which were extended around lateral surfaces of the outer frame 23 at the time of sputtering, are patterned by photolithography and then removed by metal etching. The first and second sealing patterns 201 and 202, if extended around and left on lateral surfaces of the outer frame 23, may possibly cause short circuit, the risk of which may be successfully avoided in the described manner.

The first mounting terminals 27 on the main surfaces are thus electrically connected to each other, and the second mounting terminals 28 on the main surfaces are also electrically connected to each other. Therefore, either one of the main surfaces on front and back sides may be available at the time when the piezoelectric vibrator 1 is mounted on, for example, a circuit board.

The first and second resin films 3 and 4, which are rectangular films, are bonded to front and back surfaces of the AT-cut crystal vibration plate 2 to seal the vibrating portion 21 of the AT-cut crystal vibration plate 2. These rectangular first and second resin films 3 and 4 are so sized that covers a rectangular region of the AT-cut crystal vibration plate 2 except the first and second mounting terminals 27 and 28 at both ends in the longitudinal direction of this vibration plate 2. The first and second resin films 3 and 4 are bonded to this rectangular region except the first and second mounting terminals 27 and 28. At the time, these first and second resin films 3 and 4 are firmly bonded to the first and second sealing patterns 201 and 202 having a rectangular circular shape.

In this embodiment, the first and second resin films 3 and 4 may be heat-resistant resin films, for example, films made of a polyimide resin and having heat resistance to approximately 300° C. The first and second resin films 3 and 4 made of a polyimide resin are essentially transparent, however, may possibly be opaque under certain conditions of pressure bonding under heat which will be described later. The first and second resin films 3 and 4 may be optionally transparent, semi-transparent, or opaque.

The material of the first and second resin films 3 and 4 may not necessarily be selected from the polyimide resins and may be selected from resins classified in the category of super engineering plastics, specific examples of which may include polyamide resins and polyether ether ketone resins.

The first and second resin films 3 and 4 have, on their front and back surfaces, thermoplastic adhesive layers, which are formed in the entire areas of these surfaces. In the first and second resin films 3 and 4, circumferential ends of their rectangular shapes are joined by, for example, hot pressing to the outer frame 23 of the AT-cut crystal vibration plate 2 in a manner that the vibrating portions 21 are sealed with these resin films.

By thus using the heat-resistant resin films for the first and second resin films 3 and 4, the crystal vibrator 1 may be resistant to high temperatures and thus unlikely to deform during the reflow soldering employed at the time when the crystal vibrator 1 is mounted by soldering on, for example, a circuit board.

The first, second driving electrode 25, 26; first, second mounting terminal 27, 28; first, second sealing pattern 201, 202; and first, second extraction electrode 203, 204 of the crystal vibration plate 2 may have, for example, a multilayered structure including a ground layer made of Ti (titanium) or Cr (chromium), an Au (metal) layer formed on the ground layer, and a Ti, Cr or Ni (nickel) layer further formed on the Au layer.

In this embodiment, the ground layer is a Ti layer, and Au and Ti are deposited in layers on the ground layer. The uppermost layer thus made of Ti, instead of Au, may provide an improved bonding strength to the polyimide resin.

In the first and second sealing patterns 201 and 202 to which the rectangular first and second resin films 3 and 4 are bonded, their uppermost layers include Ti, Cr, or Ni (or oxide thereof) as described above. Such a material may conduce to a better bonding strength than other materials, like Au, to the first and second resin films 3 and 4.

Next, a method for producing the crystal vibrator 1 according to this embodiment is hereinafter described.

FIGS. 5A to 5E are schematic views in cross section that illustrate steps of producing the crystal vibrator 1.

Figure 5A:
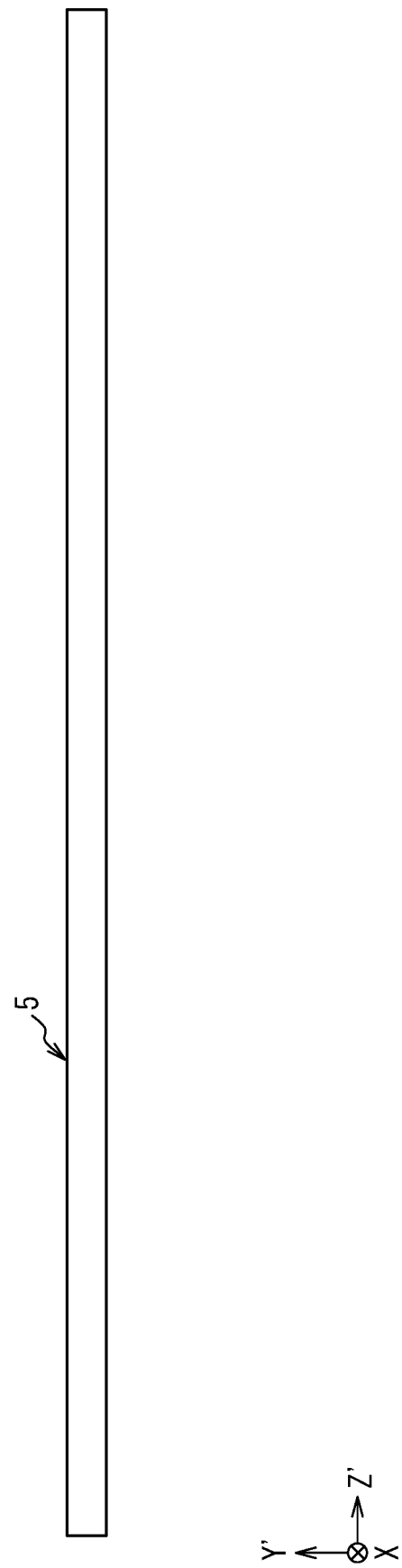
FIG. 5A is a schematic view in cross section of the crystal vibrator illustrated to describe steps of manufacturing the crystal vibrator of FIG. 1.
Figure 5B:
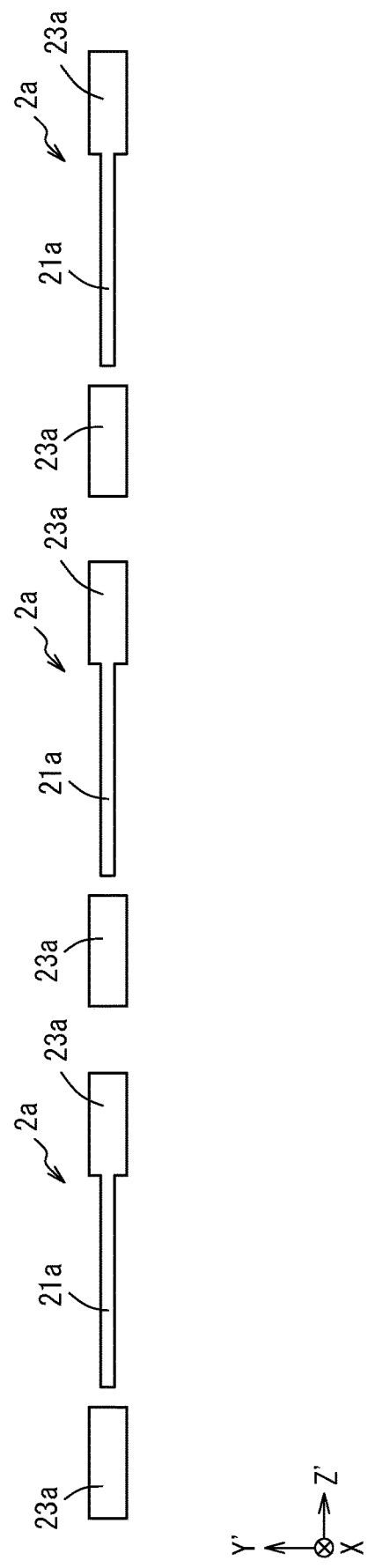
FIG. 5B is a schematic view in cross section of the crystal vibrator illustrated to describe steps of manufacturing the crystal vibrator of FIG. 1.

First, an unprocessed crystal wafer (AT-cut crystal plate) 5 is prepared, which is illustrated in FIG. 5A. As illustrated in FIG. 5B, this crystal wafer 5 is processed by photolithography and etching, for example, wet etching, into pieces that constitute the outer shape of a vibrator to be obtained; a plurality of crystal vibration plates 2a and frames supporting these vibration plates (not illustrated in the drawings). Then, the crystal vibration plates 2a are processed to have outer frames 23a and vibrating portions 21a thinner than the outer frames 23a.

Then, first and second driving electrodes 25a and 26a and first and second mounting terminals 27a and 28a are formed at predetermined positions in each of the crystal vibration plates 2a by sputtering or vapor deposition and photolithography, as illustrated in FIG. 5C.

Figure 5D:
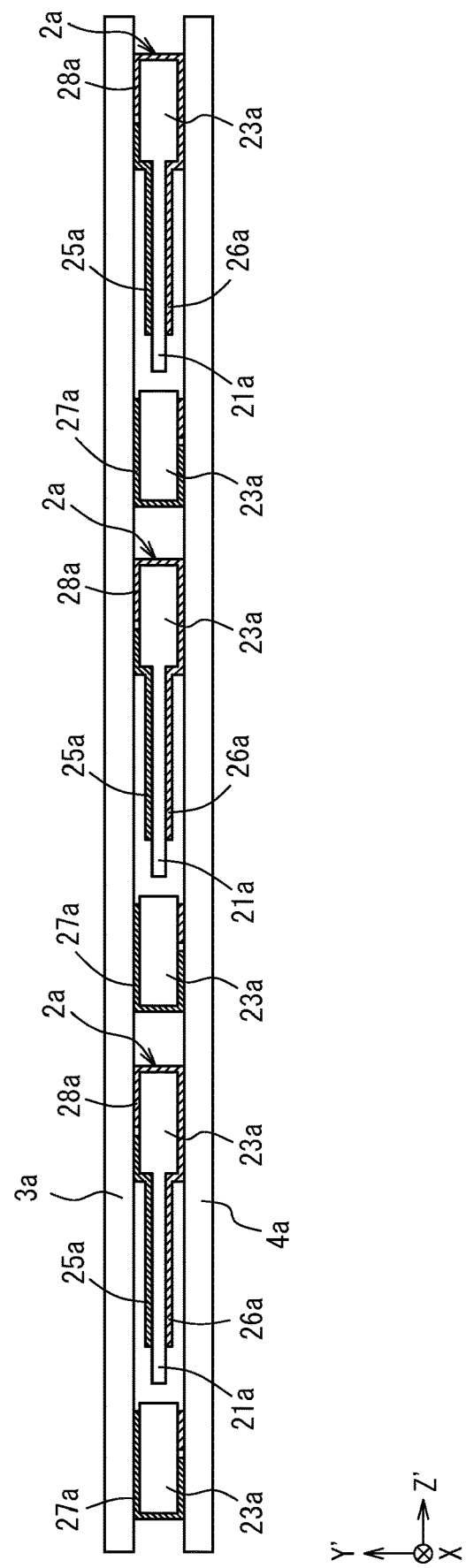
FIG. 5D is a schematic view in cross section of the crystal vibrator illustrated to describe steps of manufacturing the crystal vibrator of FIG. 1.

Further, continuous resin films 3a and 4a are bonded under heat by pressure bonding to the crystal vibration plates 2a, as illustrated in FIG. 5D, in a manner that front and back main surfaces of the crystal vibration plates 2a are covered with these resin films. Thus, the vibrating portions 21a of the crystal vibration plates 2a are tightly sealed.

The vibrating portions 21a are sealed with the resin films 3a and 4a in an inactive gas atmosphere using, for example, nitrogen gas.

Then, the continuous resin films 3a and 4a are cut at appropriate positions correspondingly to the crystal vibration plates 2 in a manner that the first and second mounting terminals 27 and 28 are partly exposed. Then, any unnecessary parts of the films are removed, and the crystal vibration plates 2 are broken into separate pieces.

A plurality of the crystal vibrators 1 illustrated in FIG. 1 are thus obtained.

In the crystal vibrator 1 according to this embodiment, the first and second resin films 3 and 4 are bonded to the front and back main surfaces of the AT-cut crystal vibration plate 2. Conventionally, recess-formed bases made of an insulation material such as ceramic may be often prepared, in which case the bases each containing a crystal vibration piece in its recess is air-tightly sealed with a lid member bonded to the base. This embodiment, however, may eliminate the need to prepare high-priced bases or lid members or mount piezoelectric vibration pieces on such bases, unlike the known art.

This may achieve cost reduction of the crystal vibrator 1, allowing the crystal vibrator 1 to be inexpensively produced and made available.

Further advantageously, the crystal vibrator 1 thus produced may be reduced in thickness (reduced in height), as compared with the known art in which, for example, a base is mounted with a piezoelectric vibration piece and sealed with a lid member.

In the crystal vibrator 1 according to this embodiment, the vibrating portions 21 are sealed with the first and second resin films 3 and 4. The crystal vibrator 1 thus structured may be relatively inferior in air-tightness, as compared with the known art in which, for example, a vibration piece-mounted base is air-tightly sealed with a metal-made or glass-made lid member joined to the base. As a result, the resonance frequency of such a crystal vibrator 1 may be more likely to degrade with time than in the known art.

The standards for frequency deviations may be rather weakly regulated for BLE (Bluetooth (registered trademark) Low Energy), among all of the applications associated with the near field communication. The crystal vibrator 1, which is an inexpensive, resin film-sealed vibrator, may be conveniently used in such applications.

In this embodiment, the first and second resin films 3 and 4 are bonded to the two main surfaces of the AT-cut crystal vibration plate 2 to seal the vibrating portion 21. Optionally, the vibrating portion 2 may be sealed with a resin film on one of the main surfaces of the AT-cut crystal vibration plate 2 and sealed with a conventional lid member on the other main surface.

In this embodiment, the first mounting terminals 27 and the second mounting terminals 28 on the main surfaces are respectively electrically interconnected through the side-face electrodes and end-face electrodes of the crystal vibration plate 2. Instead, the first mounting terminals 27 and the second mounting terminals 28 may be respectively electrically interconnected through electrodes penetrating through the main surfaces. Otherwise, the first mounting terminals 27 and the second mounting terminals 28 may be respectively electrically interconnected through the side-face electrodes and end-face electrodes and also electrically interconnected through the electrodes penetrating through the main surfaces.

The present invention is not necessarily limited to piezoelectric vibrators including crystal vibrators and may also be applicable to the other piezoelectric vibration devices including piezoelectric oscillators.

REFERENCE SIGNS LIST

1 crystal vibrator
2 crystal vibration plate
3 first resin film
4 second resin film
5 crystal wafer
21 vibrating portion
23 outer frame
24 coupling portion
25 first driving electrode
26 second driving electrode
27 first mounting terminal
28 second mounting terminal
201 first sealing pattern
202 second sealing pattern

The invention claimed is:

1. A piezoelectric vibration device, comprising:
a piezoelectric vibration plate comprising a first driving electrode and a second driving electrode, the first driving electrode being formed on one of main surfaces on both sides of the piezoelectric vibration plate, the second driving electrode being formed on another one of the main surfaces on both sides of the piezoelectric vibration plate, the piezoelectric vibration plate further comprising first and second mounting terminals that are respectively connected to the first and second driving electrodes; and
first and second sealing members that are respectively joined to the main surfaces on both sides of the piezoelectric vibration plate in a manner that the first and second driving electrodes of the piezoelectric vibration plate are covered with the first and second sealing members,
at least one of the first and second sealing members is a film comprising a resin.

2. The piezoelectric vibration device according to claim 1, wherein the first and second sealing members are each the film comprising a resin.

3. The piezoelectric vibration device according to claim 2, wherein
the piezoelectric vibration plate comprises:
a vibrating portion in which the first and second driving electrodes are formed on the main surfaces on both sides; and
an outer frame surrounding an outer circumference of the vibrating portion and coupled to the vibrating portion through a coupling portion, wherein
the vibrating portion is smaller in thickness than the outer frame, and
circumferential ends of the film are respectively joined to main surfaces on both sides of the outer frame to seal the vibrating portion.

4. The piezoelectric vibration device according to claim 3, wherein
the piezoelectric vibration plate has a rectangular shape in plan view,
the first mounting terminal is formed in the outer frame at one end of the piezoelectric vibration plate in a direction along one of two pairs of opposing sides of the rectangular shape in plan view, and
the second mounting terminal is formed in the outer frame at another end of the piezoelectric vibration plate in the direction.

5. The piezoelectric vibration device according to claim 4, wherein
the first and second mounting terminals are formed on a respective one of the main surfaces on both sides of the outer frame,
the first mounting terminals on the main surfaces on both sides are electrically connected to each other, and
the second mounting terminals on the main surfaces on both sides are electrically connected to each other.

6. The piezoelectric vibration device according to claim 4 or 5, wherein
a first sealing pattern is formed on one of the main surfaces on both sides of the outer frame, the first sealing pattern being a pattern to which the film is joined, the first sealing pattern surrounding the vibrating portion and being formed to interconnect the first driving electrode and the first mounting terminal, and
a second sealing pattern is formed on another one of the main surfaces on both sides of the outer frame, the second sealing pattern being a pattern to which the film is joined, the second sealing pattern surrounding the vibrating portion and being formed to interconnect the second driving electrode and the second mounting terminal.

7. The piezoelectric vibration device according to claim 6, wherein
the first sealing pattern and the second sealing pattern each have an extended portion extending along the one of the two pairs of opposing sides of the rectangular shape, and
the extended portions have a width smaller than a width of the outer frame extending along the one of the two pairs of opposing sides.

8. The piezoelectric vibration device according to one of claims 1 to 5, wherein
the film comprises a heat-resistant resin.

9. The piezoelectric vibration device according to claim 6, wherein
the film comprises a heat-resistant resin.

10. The piezoelectric vibration device according to claim 7, wherein
the film comprises a heat-resistant resin.

11. The piezoelectric vibration device according to one of claims 1 to 5, wherein
the film comprises a thermoplastic adhesive layer on at least one surface thereof.

12. The piezoelectric vibration device according to claim 6, wherein
the film comprises a thermoplastic adhesive layer on at least one surface thereof.

13. The piezoelectric vibration device according to claim 7, wherein
the film comprises a thermoplastic adhesive layer on at least one surface thereof.

14. The piezoelectric vibration device according to one of claims 1 to 5, wherein
the piezoelectric vibration plate is a crystal vibration plate.

15. The piezoelectric vibration device according to claim 6, wherein
the piezoelectric vibration plate is a crystal vibration plate.

16. The piezoelectric vibration device according to claim 7, wherein
the piezoelectric vibration plate is a crystal vibration plate.

\* \* \* \* \*